(12) United States Patent
Handshoe

(10) Patent No.: US 9,130,364 B1
(45) Date of Patent: Sep. 8, 2015

(54) ELECTRICAL HOT CIRCUIT INDICATOR

(71) Applicant: Becker Mining America, Inc., Barboursville, WV (US)

(72) Inventor: Sam Handshoe, Catlettsburg, KY (US)

(73) Assignee: Becker Mining America, Inc., Barboursville, WA (US)

( * ) Notice: Subject to any disclaimer, the term of this patent is extended or adjusted under 35 U.S.C. 154(b) by 0 days.

(21) Appl. No.: 14/109,069

(22) Filed: Dec. 17, 2013

Related U.S. Application Data

(60) Provisional application No. 61/738,601, filed on Dec. 18, 2012.

(51) Int. Cl.
- *H02H 3/04* (2006.01)
- *G01R 15/04* (2006.01)
- *G01R 29/18* (2006.01)

(52) U.S. Cl.
CPC .................. *H02H 3/04* (2013.01); *G01R 15/04* (2013.01); *G01R 29/18* (2013.01)

(58) Field of Classification Search
USPC .......................................................... 361/76
See application file for complete search history.

(56) References Cited

U.S. PATENT DOCUMENTS

| | | | |
|---|---|---|---|
| 2,554,510 A | 5/1951 | Spicer | |
| 2,982,827 A | 5/1961 | Goetz | |
| 3,274,356 A | 9/1966 | Godfrey | |
| 3,716,684 A | 2/1973 | McMillen | |
| 3,896,353 A | 7/1975 | Burton | |
| 4,482,936 A | 11/1984 | Saito | |
| 6,031,192 A | 2/2000 | Liebetruth | |
| 6,127,742 A | 10/2000 | Weynachter | |
| 6,169,653 B1 | 1/2001 | Engel | |
| 6,459,960 B1 * | 10/2002 | Shuto et al. | 700/293 |
| 2005/0194962 A1 * | 9/2005 | Briese et al. | 324/142 |
| 2005/0243491 A1 * | 11/2005 | Tanis | 361/104 |
| 2009/0146612 A1 * | 6/2009 | Oyobe et al. | 320/138 |

OTHER PUBLICATIONS

SAIT Mining SA—User Manual CPS 3.3kV, 1998, 22 pages.
Cutler-Hammer, Motor Control Assemblies Medium Voltage Starters (AMPGARD), 2001, 7 pages.
Cutler-Hammer, Medium-Voltage Distribution Equipment Metal-Clad Switchgear—Drawout Vacuum Breakers (VCP-W), 2001, 20 pages.
Cutler-Hammer, DS/DSII Low Voltage Switchgear Renewal Parts, 1998, 20 pages.
Cutler-Hammer, Type DSII Metal-Enclosed Low Voltage Switchgear, Technical Data, 2000, 48 pages.
Rockwell Automation, Technical Data, Draw-out Versus Fixed Mounted Contactors, 2002, 4 pages.

(Continued)

*Primary Examiner* — Dharti Patel
(74) *Attorney, Agent, or Firm* — Phyllis K Wood; PK Wood Law Office, LLC

(57) ABSTRACT

Methods and systems for a hot circuit detector/indicator that continuously monitors a three-phase network and has visual indications for phase sequence, phase presence, and phase loss. The hot circuit indicator is a compact unit that, in a preferred embodiment, includes separate light emitting diode indicators for each phase and LEDs to indicate clockwise and counter-clockwise phase sequence. The hot circuit detector/indicator also includes a relay that can be a normally open or normally closed. The hot circuit indicator can be panel mounted or integrated into a connector supplying multi-phase voltage to a load. The multi-phase voltage to be monitored can be in a range between 12 vac and 38 kVac.

19 Claims, 10 Drawing Sheets

(56) References Cited

OTHER PUBLICATIONS

Westinghouse, Receiving, Operation, Maintenance, Instructions De-ion Air Circuit Breaker, Type DH, Horizontal Drawout Infoor and Outdoor Service, 1953, 70 pages.
Westinghouse, Standardized Metal-Clad Switchgear, with type DH Magnetic De-ion Air Circuit Breakers, 1961.
Westinghouse, Instructions for Type VCP Vacuum Circuit Breakers, 1982, 29 pages.
Powercon Corp, Instruction Book, Horizontal Drawout Metal-Clad Switchgear with Westinghouse Vacuum Circuit Breakers, 1990, 16 pages.
Powell Apparatus Service, Specification for Westinghouse DHP Circuit Breakers, 2004, 7 pages.
VersaRupter Family, Installation/Maintenance Instructions, 2002, 26 pages.
Line Power, Vacuum Circuit Breakers and Feeder Protectors, retrieved on Oct. 21, 2013, retrieved from http://linepower.com/products/Circuit%20Brekaers%20and%20Feeder%20Protectorts/circ . . . , 7 pages.
Federal Pacific, MAVRiC: Vacuum Fault Interrupters, 2012, retrieved on Oct. 23, 2013, retrieved from http://www.federalpacific.com/literature/sgear/PC-11A-310.pdf, 8 pages.
Federal Pacific, Auto-jet Loadbreak Switches, retrieved on Oct. 23, 2013, retrieved from http:/Iwww.federalpacific.com/productcart/pc/viewPrd.asp?idcategory=17&product=26, 4 pages.
Cutler Hammer, Type PSI/II Padmount Switchgear, 1998, 11 pages.
Sunbelt Transformer, Type PSI/II Pad-Mount Switchgear: Instructions for Installation and Operation, 2006, 16 pages.
Line Power, DTS Down Time Saver, retrieved on Oct. 21, 2013, retrieved from http://linepower.com/literature/pdf/LPMS-DTS.pdf, 3 pages.
Line Power, DTS Down Time Saver, retrieved on Oct. 21, 2013, retrieved from http://www.federalpacific.com/literature/lineup/LPMS-DTS-0606.PDF, 2 pages.

* cited by examiner

ELECTRICAL HOT CIRCUIT INDICATOR

CROSS REFERENCE TO RELATED APPLICATIONS

This application claims the benefit of priority to U.S. Provisional Application Ser. 61/738,601 filed Dec. 18, 2012. The entire disclosure of which is incorporated herein by specific reference thereto.

FIELD OF THE INVENTION

This invention relates to an electrical circuit detector and, in particular, to methods, systems and devices for a hot circuit detector that continuously monitors a three-phase network and indicates phase sequence, phase presence, and phase loss.

BACKGROUND AND PRIOR ART

In an industrial environment, high voltage power is supplied to industrial equipment such as electrical motors. Typically incoming high voltage is supplied to a power distribution unit for distribution to the industrial equipment. At each power cell, each phase of the incoming power is connected to a voltage interrupter, such as a circuit breaker or vacuum interrupter such that when a fault occurs, the interrupter trips to an open state to remove power to the electrical equipment. The power cell typically also includes ground monitoring and ground fault circuits. The output of each power cell is connected directly to the industrial motor via a high voltage coupler.

While the power distribution unit includes indicators to display the status of the incoming high voltage lines, the status of each phase of the voltage is not monitored at the connection to the motor nor is there a physical indication of the status. Instead, when the motor stops, the operator is unable to quickly determine the source of the fault that has caused the motor to stop operating. The fault may be the electrical source, an equipment failure or the motor itself.

For example, the malfunction may be a stuck contactor bottle or stuck mechanical contactor that fails to disconnect when the power is disconnected. The fault leaves the motor circuit energized, undetected by the electrician. If the coupler connecting the high voltage from the power cell to the motor is disconnected from a circuit in an energized state, the disconnection could cause personnel injury or equipment damage.

Another anomaly is when the bottle or contact fails to close, resulting in single phasing and eventually damaging the motor. Also, if a circuit to a hydraulic motor for fan operates in reverse sequence, this fault may result in dangerous or damaging consequences.

To solve the above problems, what is needed is a detection device to provide an indication when the voltage and/or the phase rotation are not correct to protect the operator and prevent equipment damage, thus maximizing production.

SUMMARY OF THE INVENTION

A primary objective of the present invention is to provide methods, systems and devices for a hot circuit indicator that utilizes dual LEDs for each phase to indicate phase presence.

A secondary objective of the present invention is to provide methods, systems and devices for phase loss detection is indicated by LED conditions on the faceplate as well as a relay terminal block mounted on the rear of the unit to disconnect the power when a fault is detected.

A third objective of the present invention is to provide methods, systems and devices for a hot circuit indicator wherein clockwise phase sequence is indicated by illuminating the LED labeled CW and counter clockwise phase sequence is indicated by illuminating the LED labeled CCW.

A fourth objective of the present invention is to provide methods, systems and devices for a hot circuit indicator integrated with a coupler that connects the source power to the equipment.

A fifth objective of the present invention is to provide methods, systems and devices for a hot circuit indicator that uses dual LEDs for each phase to indicate phase presence and shows a clockwise phase sequence by illuminating the LED labeled as CW and shows the counter clockwise phase sequence by illuminating the LED labeled CCW.

A first embodiment of the present invention provides a hot circuit indicator device that includes a phase voltage detector to detect a present and a loss of two or more electric phases, a phase rotation detector to detect a sequence of the two or more electric phases, a phase voltage indicator corresponding to each one of the one or more electric phases to show the present and loss of each phase, a phase rotation indicator to show one of a clockwise and a counterclockwise sequence of the two or more electric phases, a microprocessor for illuminating the phase present indicator and the phase rotation indicator based on the detected phase voltage and the detected phase sequence, and a relay contact controlled by the microprocessor disconnect power to a load when a phase loss or phase reversal condition is detected.

The phase voltage indicator can include a light emitting diode corresponding to each one of the two or more phases or two light emitting diode each corresponding to one of a phase voltage present detection and a phase voltage loss detection. The phase rotation indicator can include a light emitting diode (LED) corresponding to each one of the clockwise and the counterclockwise rotational sequence of two or more phases, the microprocessor illuminating one of the clockwise and the counterclockwise corresponding to the detected phase rotation.

The hot circuit indicator of claim includes a phase voltage reducer and overvoltage clamp to reduce the phase voltage of each one of the two or more phases for voltage and phase detection. An internal or external dc power source supplies DC voltage to the detectors, indicators and microprocessor. The hot circuit indicator can be integrated into a coupler to connect an incoming phase voltage to a load or can be panel mounted.

A second embodiment provides a method for indicating a phase voltage and a phase rotation of a multi-phase power source that includes the steps of monitoring the voltage level of each phase of the multi-phase voltage source, monitoring a sequence of rotation of the multi-phase voltage source, a processing device to determine a present or loss of phase voltage for each phase of the multi-phase voltage source based on the voltage level monitoring and determining a phase rotation of the multi-phase voltage source, a phase voltage indicator corresponding to each phase of the multi-phase voltage source to show the present or the loss of one of more of the multi-phases, and a first and second phase rotation indicator each corresponding to one of a clockwise and a counterclockwise rotation of the multiphase voltage source, the microprocessor illuminating one of the first and second phase rotation indicators based on the phase sequence detection. The method includes energizing a relay to disconnect the multi-phase voltage source when a phase voltage loss is detected and energizing a relay to disconnect the multi-phase voltage source when a phase rotation reversal is detected.

The method can include the step of rectifying and regulating the reduced multi-phase voltage to produce an internal DC operating voltage or providing an external DC operating voltage.

The phase voltage level monitoring can include monitoring a phase voltage level and phase voltage rotation of an approximately 120 vac to approximately 575 vac multi-phase voltage source or monitoring a phase voltage level and phase voltage rotation of a multi-phase voltage source up to approximately 38 kVac.

Further objects and advantages of this invention will be apparent from the following detailed description of preferred embodiments which are illustrated schematically in the accompanying drawings.

BRIEF DESCRIPTION OF THE FIGURES

FIG. 1b is a front view of a panel mount electrical hot circuit indicator shown in FIG. 1a.

FIG. 2b is a top view of the smart coupler shown in FIG. 2a.

DESCRIPTION OF THE PREFERRED EMBODIMENTS

Figure 1A:
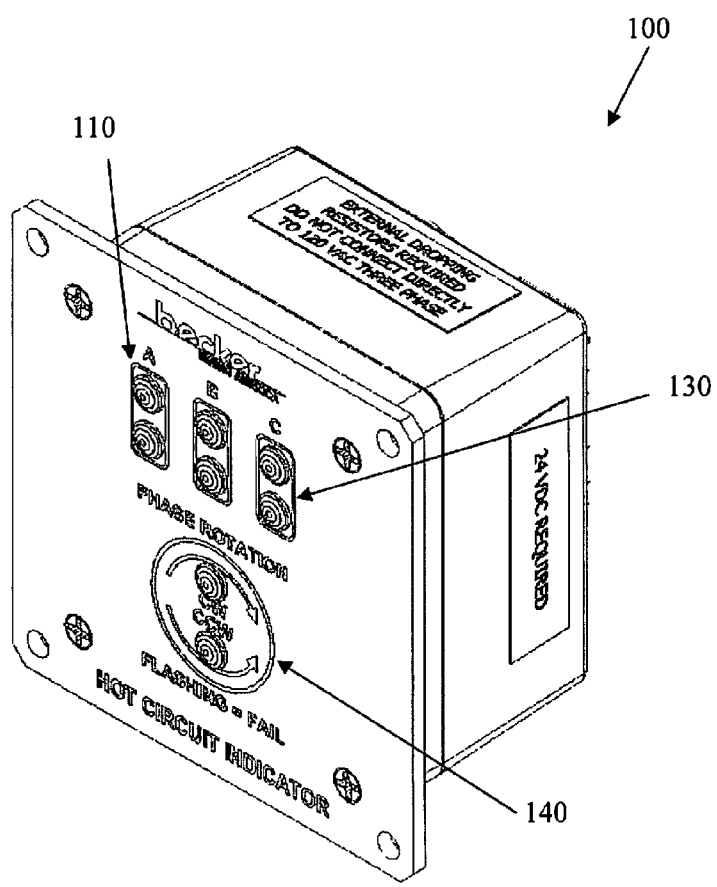
FIG. 1a is a perspective view of a panel mount electrical hot circuit indicator according to a the present invention.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

In this section, some embodiments of the invention will be described more fully with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will convey the scope of the invention to those skilled in the art. Like numbers refer to like elements throughout, and prime notation is used to indicate similar elements in alternative embodiments.

A list of components will now be described.
100 hot circuit indicator
110 phase A indicators
120 phase B indicators
130 phase C indicators
140 phase rotation indicators
200 smart hot circuit detector coupler
210 male contacts
220 trailing cable connection
310 three phase network
320 phase voltage reducer/over voltage clamp
330 half wave rectifier
340 voltage regulator
350 phase rotation and voltage monitor
360 microprocessor
370 phase rotation indicators
375 phase voltage indicators
380 relay
400 intermediate resistor assembly
500 external dc power source It would be useful to discuss the meanings of some words used herein and their application before discussing the firearm of the present invention with a downward ejecting mechanism.

"Hot circuit indicator," "hot circuit detector", "hot coupler" and "smart coupler" are used interchangeably to mean an electronic device connected between a power source and a load to monitor incoming phase voltages and illuminate indicators to show the status of the phase voltage and the phase rotation.

Figure 1B:
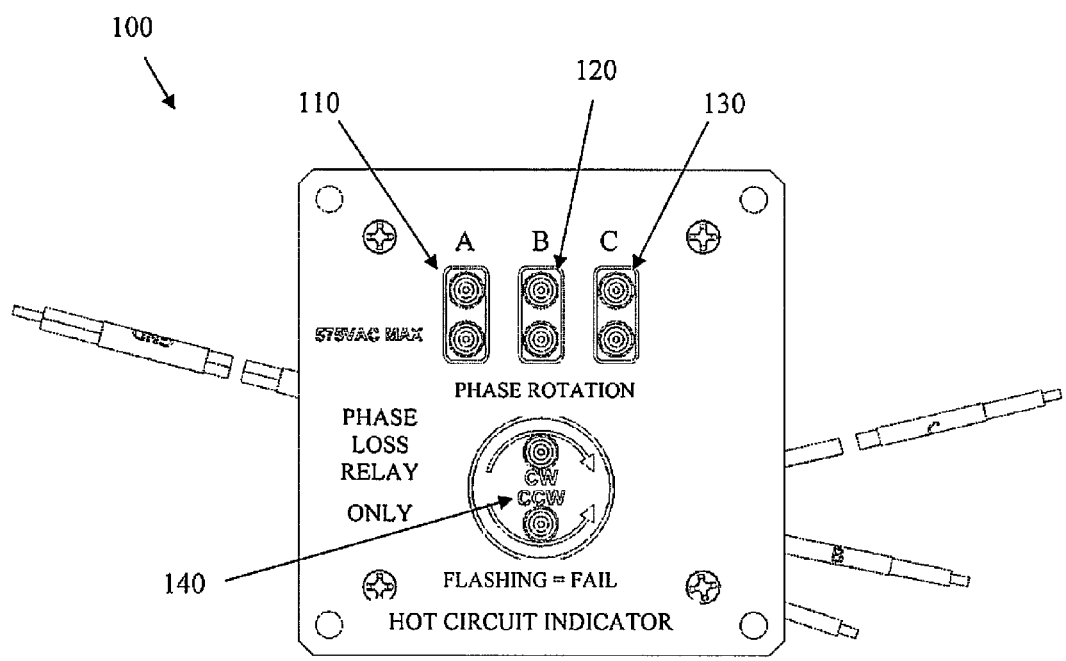

The methods, systems and devices of the present invention provide a hot circuit detector/indicator that continuously monitors a three-phase network. The hot circuit indicator has visual indications for phase sequence, phase presence, and phase loss. FIG. 1 is a perspective view of a panel mount electrical hot circuit detector 100 according to a preferred embodiment of the invention. As shown, the hot circuit indicator 100 is a compact unit that, in a preferred embodiment, includes separate light emitting diode indicators for each phase 110, 120 and 130 and two LEDs 140 to indicate clockwise and counter-clockwise phase sequence of the three phase network.

Figure 2A:
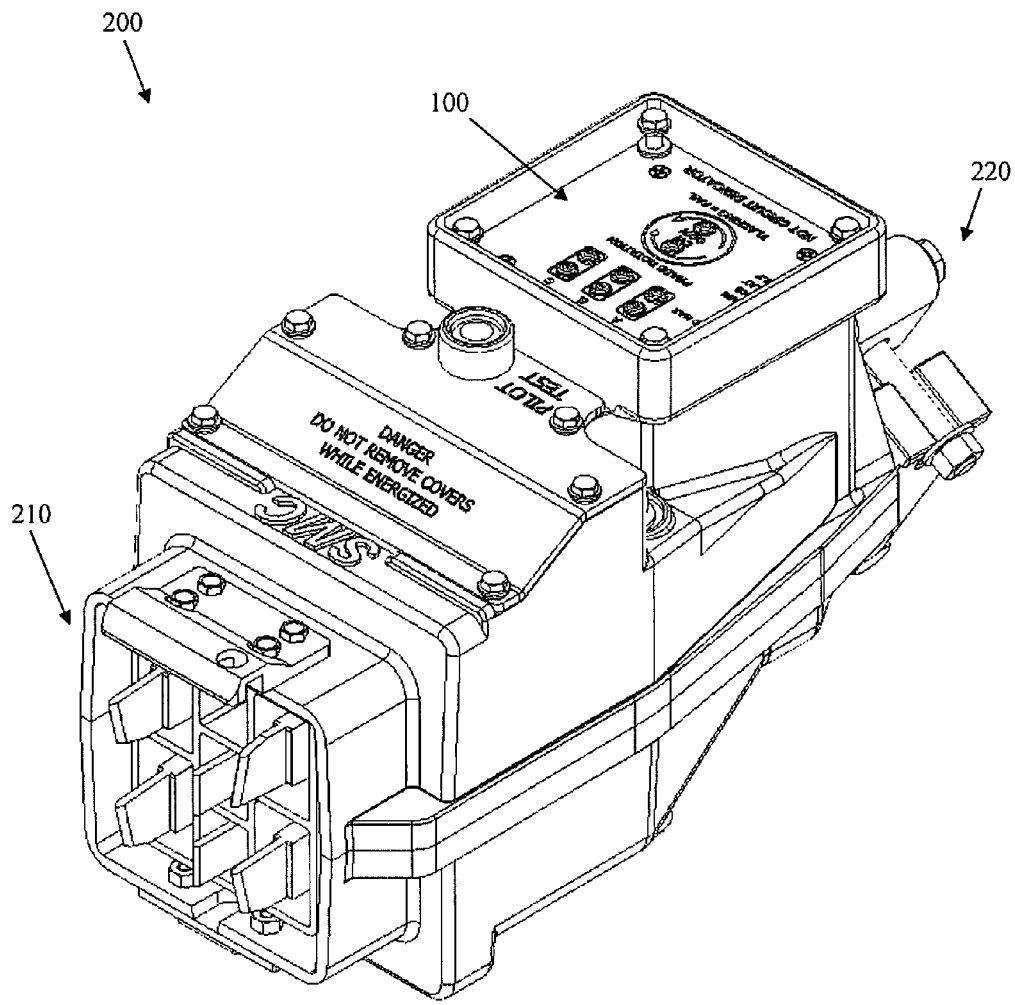
FIG. 2a is a perspective view of a smart coupler with the hot circuit detector integrated with the coupler.
Figure 2B:
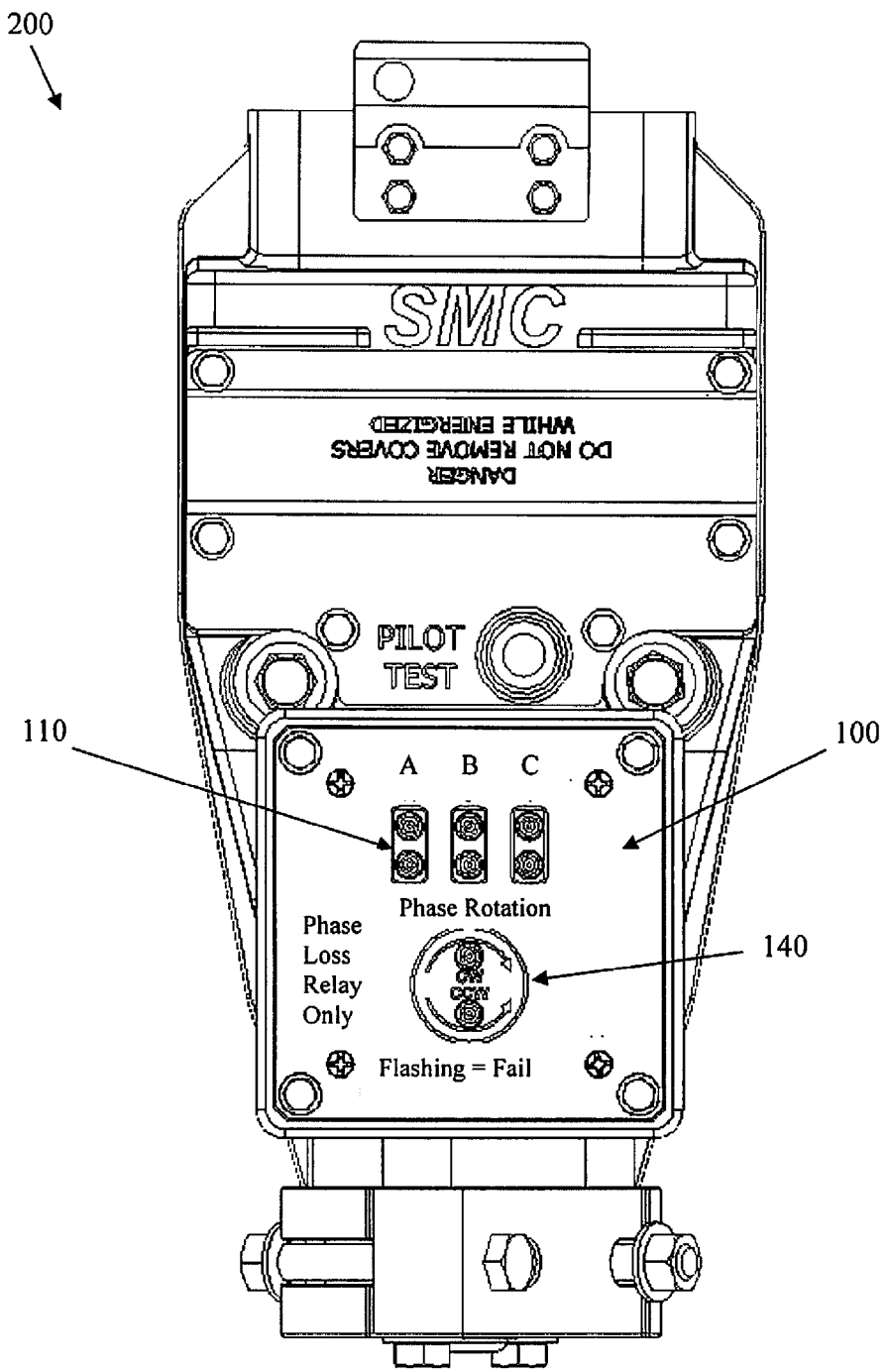

In industrial applications three phase incoming power is fed into a power distribution unit where multiple power cells connected to the incoming power buss are used to distribute the three phase power to different loads, such as motors, industrial equipment and self-propelled machinery. A trailing cable used to connect the power cell to the load has a connector, or coupler 200, at the load end. The hot circuit detector 100 can be incorporated into the coupler 200 as shown in FIGS. 2a and 2b. Both the panel mounted hot circuit detector 100 and the coupler embedded hot circuit detector 200 monitor incoming power and illuminates LEDs to indicate the status of the incoming power. The status includes a voltage present and phase rotation indication for each phase and provides equipment protection by disconnecting incoming power when a fault is detected.

The hot circuit indicator 100 shows that each of the different phases is present, or if one or more of the phases are lost. When one or more phases are lost, the voltage level LEDs 110, 120 and 130 indicate which phase or phases are lost and the circuit is tripped to disconnect the power source. The hot circuit indicator also illuminates LEDs 140 to show the direction of phase rotation and if the rotation reverses, the circuit is tripped to disconnect the power source. The hot circuit indicator can be configured to include a normally open contact or normally closed fail safe contact to automatically disconnect the source power when a phase loss or phase fault is detected.

The hot circuit indicator 100 shown in FIG. 1 is configured to be panel mounted and thus includes mounting holes, one located in each of the four corners of the faceplate. Alternatively, the hot circuit indicator chassis can be configured to slide into and out of a frame as a draw out cell. As shown in FIG. 2b, the hot circuit indicator 100 can be incorporated into the coupler 200. In the examples shown, the faceplate dimensions are approximately 4.0 square inches. In a preferred embodiment, for industrial applications, the hot circuit indicator is potted and encapsulated.

Physically, the three-phase network to be monitored by the hot circuit indicator is supplied to the unit via four 16-gauge high voltage wires, one for each phase and ground. The hot circuit indicator can be configured for voltage levels within a range of 120 vac up to 575 vac and can be configured with intermediate devices for voltages up to approximately 38 kVac. The hot circuit indicator can also be configured for either a normally closed (fail safe) relay contact output or a normally open relay contact output.

Figure 3:
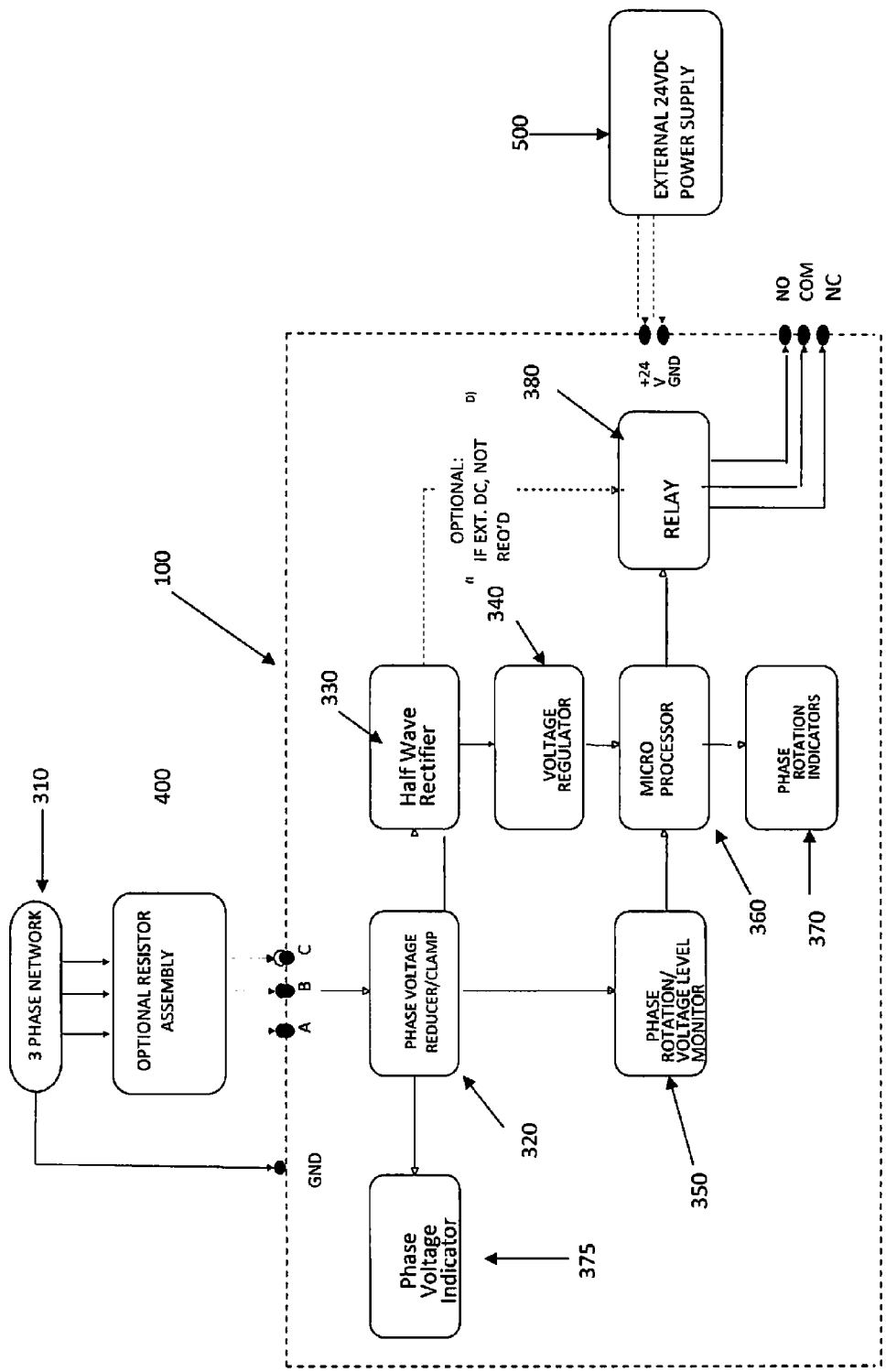
FIG. 3 is a schematic block diagram of the hot circuit indicator shown in FIGS. 1 and 2.

FIG. 3 is a schematic block diagram of the hot circuit indicator according to the present invention. As shown, the hot circuit indicator monitors a three phase network 310. Depending on the voltage of the three phase network 310, an intermediary device 400 may be required which is shown as an optional resistor assembly 400 to drop a very high voltage to a lower voltage compatible with the hot circuit indicator electronic circuit components. For example, when the three phase network is a low voltage such as 120 vac, 240 vac or even 575 vac the optional intermediary resistor assembly is not required. For monitoring of higher voltage three phase networks, such as 995 vac or 15 kVac, the intermediate device 400 is required. When configured with the intermediate device, the hot circuit indictor can be used to monitor three phase networks up to and including approximately 38 KVac.

The hot circuit indicator internal circuit components have an operating voltage of 24 vdc which can be supplied from an external voltage source 500 or an internal half wave rectifier 330 and voltage regulator 340 shown as optional in FIG. 3. The hot circuit indicator is a smart device since it is a microprocessor based detector and indicating device.

As shown, the three phase network is fed to an internal phase voltage reducer 320 and over voltage clamp circuit. The voltage level detectors and phase rotation detectors 350 monitors each phase. Referring back to FIG. 1, the hot circuit indicator has three sets of indicators 110, 120 and 130, one set of dual indicators for each phase to visually indicate the phase presence. For example, one indicator in each set can be green indicating the present of the phase and the second indicator can be red to indicate an absence of a phase. Two phase indicators 140 along with arrows show the detected phase rotation. Phase rotation sequence can be clockwise (ABC) or counterclockwise (CBA). The hot circuit indictor device shows the phase rotation graphically with an arrow corresponding to each one of the clockwise and counterclockwise LEDs 140.

Referring back to the schematic block diagram shown in FIG. 3, the phase voltage and phase rotation detectors supply a voltage level and phase signal corresponding to each phase to the microprocessor 360. When the input signal indicates phase presence the microprocessor illuminates the phase present LED 375 corresponding to each one of the phases. Likewise, when the input phase rotation signal indicates proper rotational direction, the microprocessor illuminates the corresponding one of the clockwise and counterclockwise phase rotation LEDs 370.

When the phase voltage level and phase rotation signals indicate the absence of one or more phases or a change in the rotational sequence of the phases, the microprocessor energizes the relay 380 to disconnect the power supplied to the load. Simultaneously, the fault is shown on the phase voltage level indicators and or phase rotation indicators.

Figure 4A:
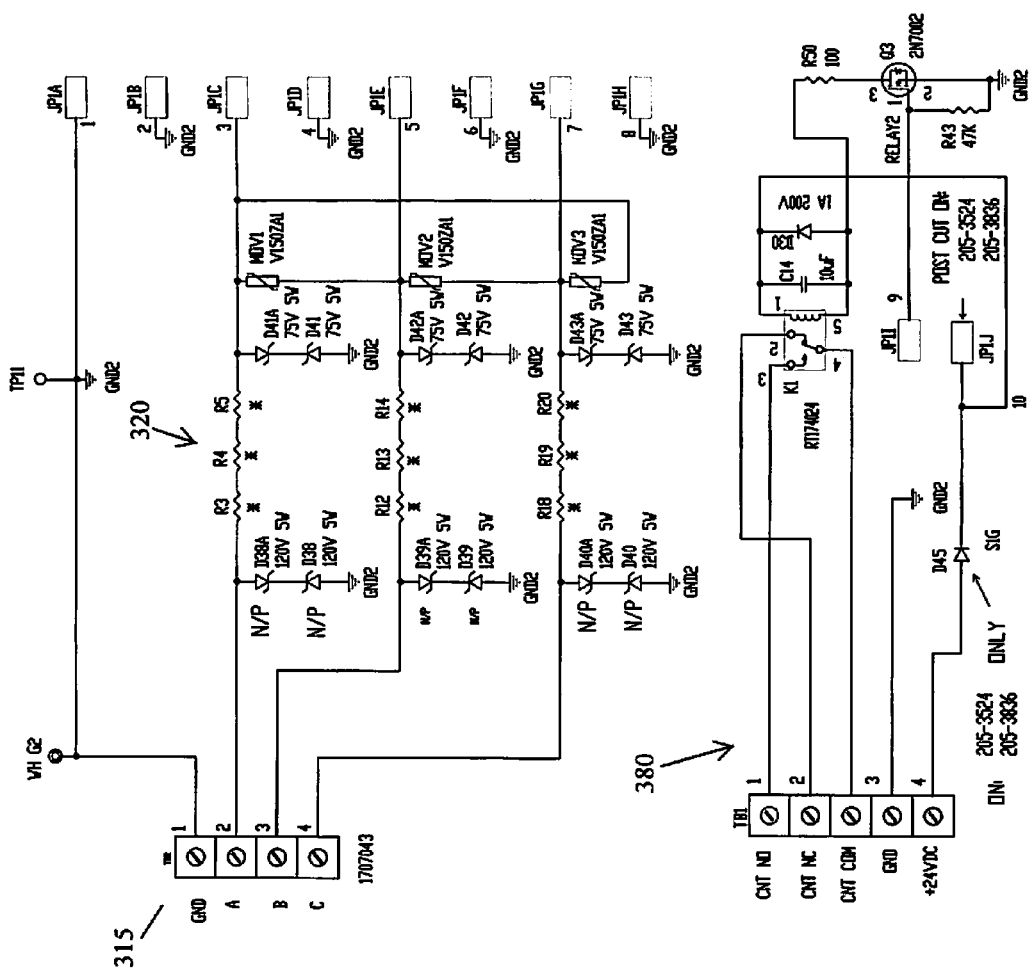
FIG. 4a is a schematic diagram of the hot circuit indicator shown in FIGS. 1 and 2.
Figure 4B:
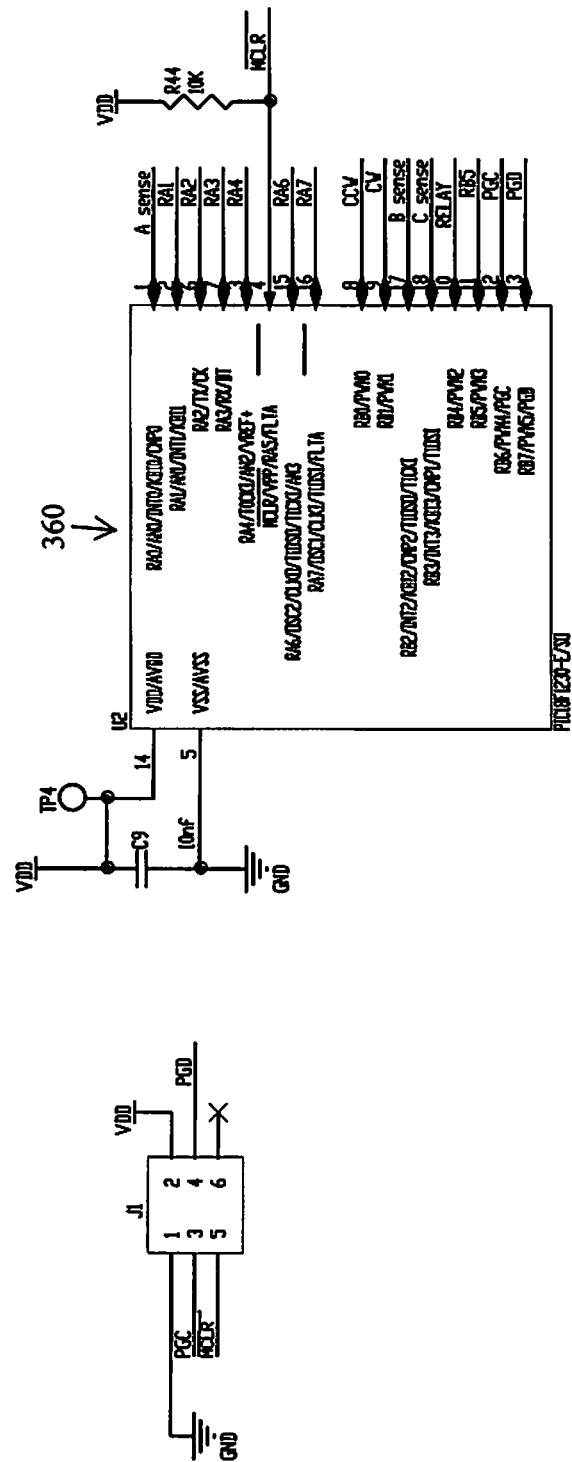
FIG. 4b is a continuation of the schematic diagram shown in FIG. 4a showing an example of the microprocessor pin configuration.
Figure 4C:
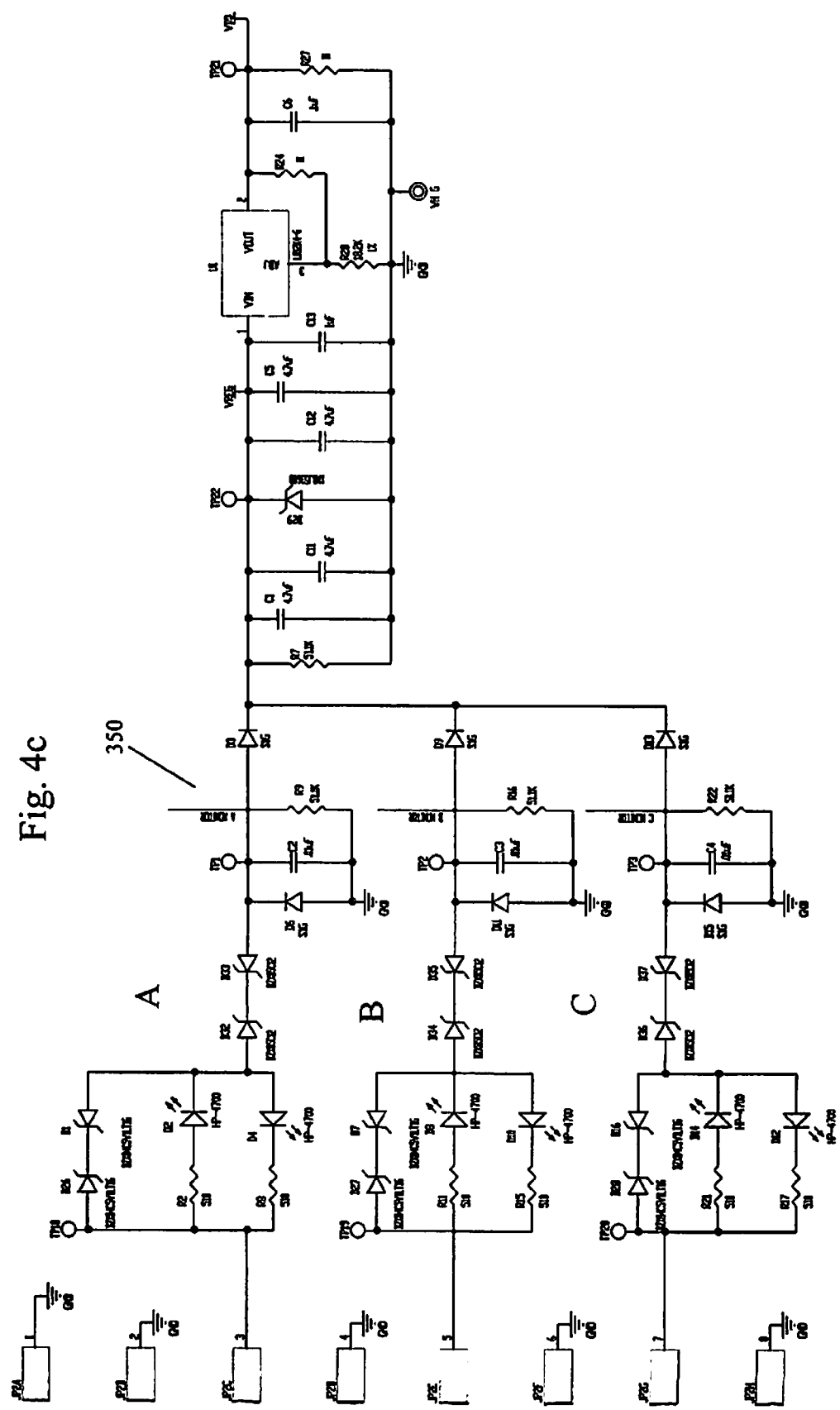
FIG. 4c is a continuation of the schematic diagram shown in FIG. 4a showing circuitry for monitoring phase voltage.
Figure 4D:
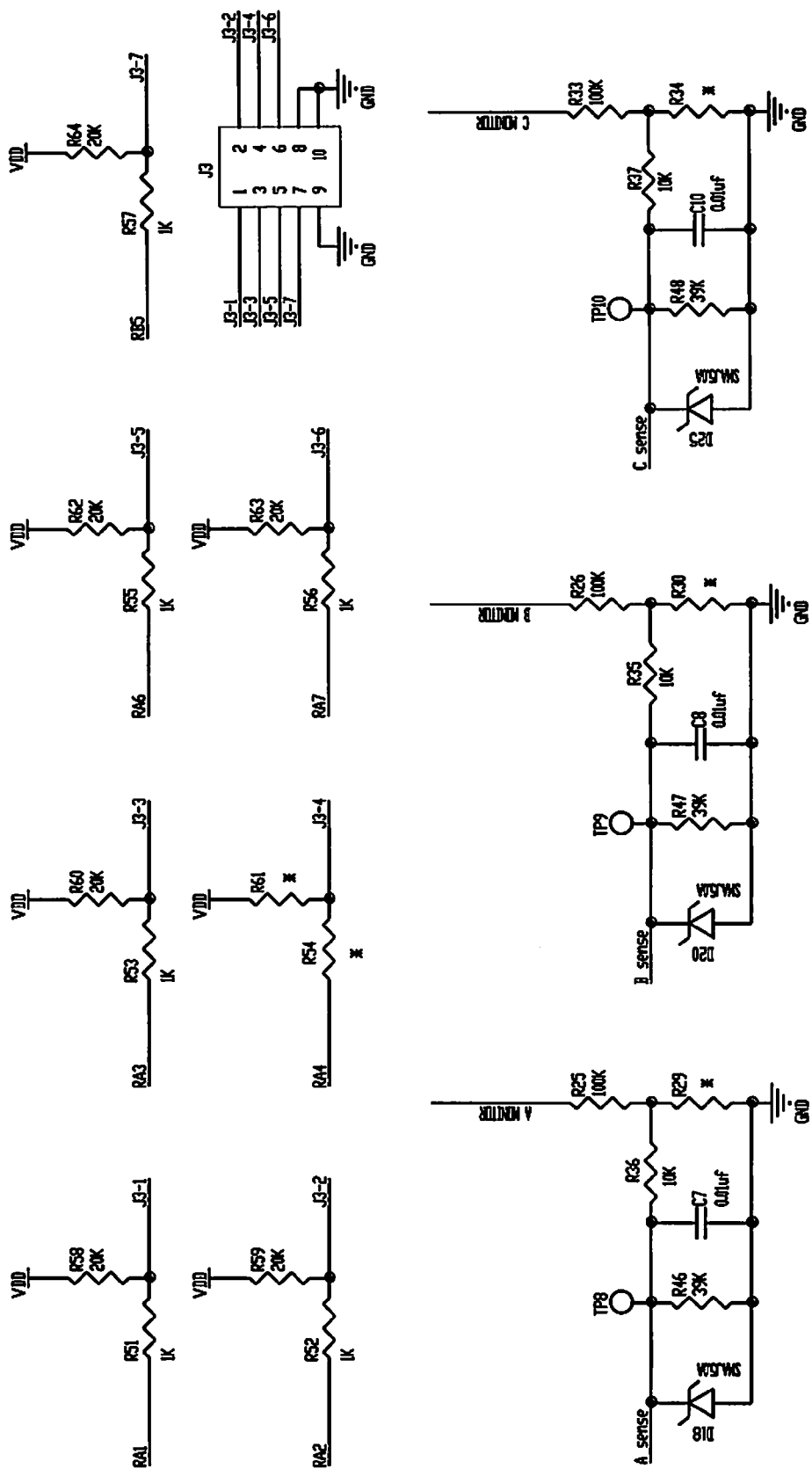
FIG. 4d is a continuation of the schematic diagram shown in FIG. 4c showing circuitry for monitoring phase voltage.
Figure 4E:
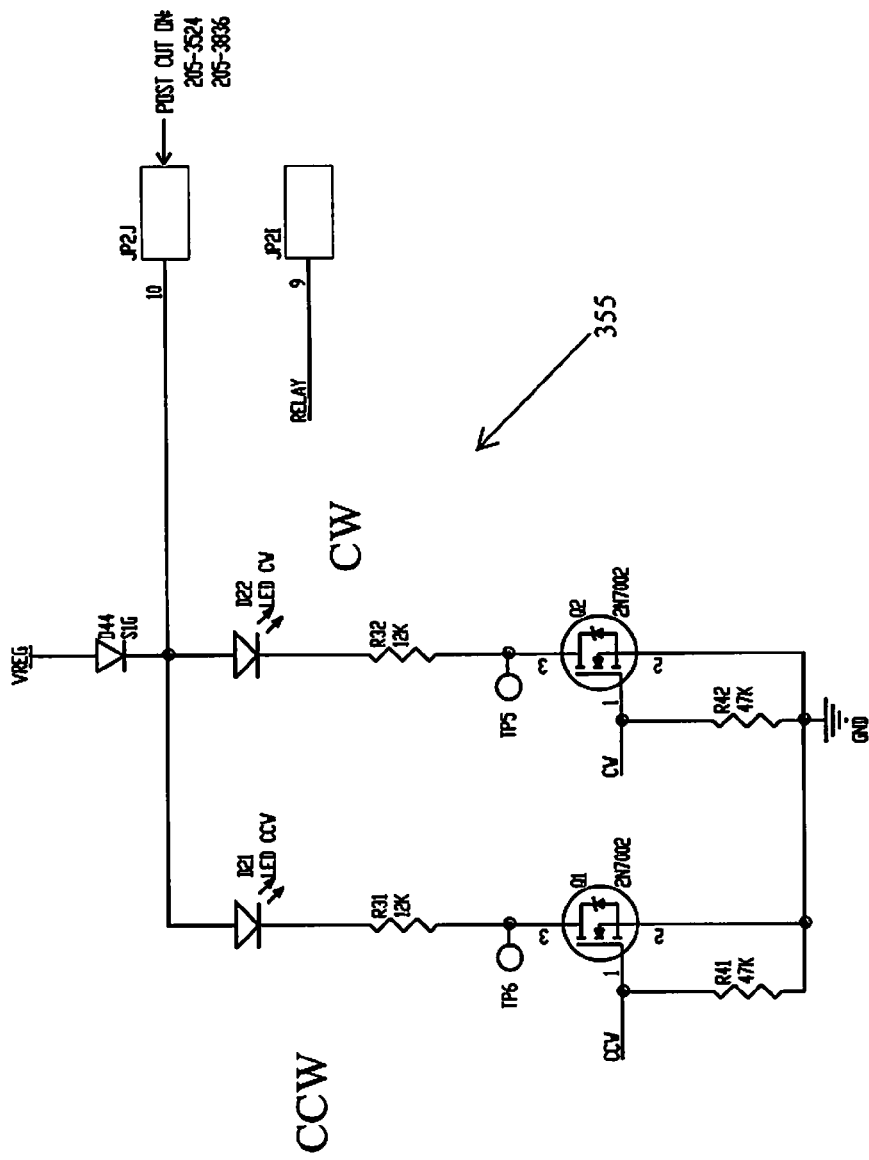
FIG. 4e is a continuation of the schematic diagram shown in FIG. 4c showing circuitry for monitoring phase rotation.

FIGS. 4a through 4e are a schematic diagram of an example for implementing the electrical hot circuit indicator. For example, the phase voltage reducer and overvoltage clamp 320 can be implemented using resistors and zener diodes as shown in FIG. 4a. The phase voltage level detector 350 is shown in FIGS. 4c and 4d, and the phase rotation detector 355 is shown in FIG. 4e. Functionally, when all phases are present, the sets of dual LEDs for each phase A, B, and C are illuminated and one of the CW or CCW LEDs is illuminated to indicate the phase sequence.

The relay circuit 380 shown in FIG. 4a shows connection to the form C relay which includes one normally open and one normally closed contact which is in a closed position to indicate that all three phases are detected and the proper rotation is detected. When a phase loss condition is present, the set of phase voltage level LEDs corresponding to the failed phase are not illuminated and the CW and CCW LEDs flash off and on to indicate a phase loss failure state. When one or more phase loss conditions are detected, the normally closed relay terminal opens to disconnect the power to the load. When power is not supplied, the relay terminal remains in the closed position.

In the alternative embodiment, the hot circuit indicator is integrated with a coupler as shown in FIG. 2a. One skilled in the art should realize that the particularities in the coupler should not be construed as limitation of the preferred embodiment. Various different coupler types and configurations can be chosen and optimized for a particular application and use in a particular environment.

One skilled in the art should realize that the particularities in the hot circuit indicator should not be construed as limitation of the preferred embodiment. Various system configurations and corresponding components may be chosen and optimized for a particular application to achieve a desired performance. For example, the hot circuit indicator is shown and described for monitoring a three phase network although the hot circuit indicator can be configured to monitor an alternative number of phases.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. A hot circuit indicator device comprising:
a high voltage wire energized up to approximately 38 KV phase to phase of a three phase high voltage network connected to the hot circuit indicator device;
a phase voltage detector to monitor a presence of each one of the three phases and detect a loss of one or more of the three phases;
a phase rotation detector to monitor and detect a sequence of the three phases of the three phase high voltage network and output a phase rotation signal;
a phase voltage indicator corresponding to each one of the three phases to show the present and loss of each phase;
a phase rotation indicator to show one of a clockwise and a counterclockwise sequence of the three phases;
a microprocessor for receiving the phase rotation signal and illuminating the phase present indicators and the phase rotation indicator based on the received phase rotation signal corresponding to the detected phase voltage and the detected phase sequence; and
a relay contact controlled by the microprocessor to automatically disconnect power to a load when a phase loss or phase reversal condition is detected.

2. The hot circuit indicator of claim 1 wherein the phase voltage indicator comprises:
   a light emitting diode corresponding to each one of the three phases.
3. The hot circuit indicator of claim 2 wherein the light emitting diode comprises:
   a first, second and a third light emitting diode each corresponding to one of the three phases to indicate a phase voltage present detection and a phase voltage loss detection.
4. The hot circuit indicator of claim 1 wherein the phase rotation indicator comprises:
   a light emitting diode corresponding to each one of a clockwise and a counterclockwise rotational sequence of the three phases, the microprocessor illuminating one of the clockwise and the counterclockwise corresponding to the received phase rotation signal.
5. The hot circuit indicator of claim 1, further comprising:
   a phase voltage reducer and overvoltage clamp to reduce the phase voltage of each one of the three phases for voltage and phase detection.
6. The hot circuit indicator of claim 1 further comprising:
   a DC power source for supplying DC voltage to the detectors, indicators and microprocessor.
7. The hot circuit indicator of claim 1 wherein the relay contact comprises:
   a normally open relay terminal corresponding to each phase of the three phase high voltage network.
8. The hot circuit indicator of claim 1 wherein the relay contact comprises:
   a normally closed relay terminal corresponding to each phase of the three phase high voltage network.
9. The hot circuit indicator of claim 1 further comprising:
   a trailing cable connector to connect an incoming three phase high voltage to a load, the hot circuit indicator integrated into the trailing cable connector between the three phase high voltage source and the load.
10. The hot circuit indicator of claim 1 further comprising:
    a housing for panel mounting the hot circuit indicator.
11. A method for indicating a phase voltage and a phase rotation of a three phase power source comprising the steps of:
    connecting a high voltage wire for each phase and ground from the three phase power source to a hot circuit indicator device;
    at the three phase hot circuit indicator device,
    monitoring a presence of each phase of the three phase voltage source to detect a loss of one or more of the three phases;
    monitoring a sequence of rotation of the three phase voltage source and output a phase rotation signal;
    providing a processing device to determine a presence or loss of phase voltage for each phase of the three phase voltage source based on the voltage level monitoring and determining a phase rotation of the three phase voltage source based on a received phase rotation signal corresponding to the phase voltage and phase sequence;
    providing a phase voltage indicator corresponding to each phase of the three phase voltage source to show the presence or the loss of each of the three phases;
    providing a first and second phase rotation indicator each corresponding to one of a clockwise and a counterclockwise rotation of the three phase voltage source, the microprocessor illuminating one of the first and second phase rotation indicators based on the phase sequence detection; and
    automatically disconnecting the three phase power source from a load when a phase loss or phase reversal condition is detected.
12. The method of claim 11, further comprising the step of:
    reducing a voltage level of each phase of the three phase voltage source before the phase voltage monitoring and the phase sequence monitoring.
13. The method of claim 12 further comprising the step of:
    rectifying and regulating the reduced three phase voltage to produce an internal DC operating voltage.
14. The method of claim 12 wherein the phase voltage level monitoring step includes the step of:
    monitoring a phase voltage level and phase voltage rotation of a three phase voltage source up to approximately 38 kVac.
15. The method of claim 11 wherein the automatically disconnecting step comprises the step of:
    energizing a relay to automatically disconnect the three phase voltage source when a phase voltage loss is detected.
16. The method of claim 11 wherein the automatically disconnecting step comprises the step of:
    energizing a relay to automatically disconnect the three phase voltage source when a phase rotation reversal is detected.
17. The method of claim 11 further comprising the step of:
    providing a trailing cable connector for connecting the three phase voltage source with a load; and
    integrating the monitoring, processing and indicating into the trailing cable connector as a smart hot circuit indicator.
18. The method of claim 11 further comprising the step of:
    enclosing the monitoring, processing and indicating devices into a housing as a panel mount hot circuit indicator.
19. The method of claim 11 wherein the phase voltage level monitoring step includes the step of:
    monitoring a phase voltage level and phase voltage rotation of an approximately 120 vac to approximately 575 vac three phase voltage source.

* * * * *